(12) United States Patent
Feng et al.

(10) Patent No.: US 9,530,646 B2
(45) Date of Patent: Dec. 27, 2016

(54) METHOD OF FORMING A SEMICONDUCTOR STRUCTURE

(71) Applicant: UNITED MICROELECTRONICS CORP., Hsin-Chu (TW)

(72) Inventors: Li-Wei Feng, Kaohsiung (TW); Shih-Hung Tsai, Tainan (TW); Chao-Hung Lin, Changhua County (TW); Hon-Huei Liu, Kaohsiung (TW); An-Chi Liu, Tainan (TW); Chih-Wei Wu, New Taipei (TW); Jyh-Shyang Jenq, Pingtung County (TW); Shih-Fang Hong, Tainan (TW); En-Chiuan Liou, Tainan (TW); Ssu-I Fu, Kaohsiung (TW); Yu-Hsiang Hung, Tainan (TW); Chih-Kai Hsu, Tainan (TW); Mei-Chen Chen, Tainan (TW); Chia-Hsun Tseng, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 64 days.

(21) Appl. No.: 14/629,491

(22) Filed: Feb. 24, 2015

(65) Prior Publication Data

US 2016/0247678 A1    Aug. 25, 2016

(51) Int. Cl.
  *H01L 21/8234* (2006.01)
  *H01L 21/033* (2006.01)
  *H01L 21/66* (2006.01)
  *H01L 21/308* (2006.01)

(52) U.S. Cl.
  CPC ....... *H01L 21/0337* (2013.01); *H01L 21/0338* (2013.01); *H01L 21/3083* (2013.01); *H01L 21/823431* (2013.01); *H01L 22/12* (2013.01)

(58) Field of Classification Search
  CPC ................... H01L 21/02296; H01L 21/02365; H01L 21/02518; H01L 21/8232
  See application file for complete search history.

(56) References Cited

U.S. PATENT DOCUMENTS

| 7,396,781 | B2 | 7/2008 | Wells | |
|---|---|---|---|---|
| 8,679,981 | B1 | 3/2014 | Weling et al. | |
| 2006/0046200 | A1* | 3/2006 | Abatchev | H01L 21/0337 430/313 |
| 2006/0281266 | A1* | 12/2006 | Wells | H01L 21/0337 438/299 |
| 2009/0004867 | A1 | 1/2009 | Yune | |
| 2013/0234301 | A1 | 9/2013 | Wang et al. | |
| 2014/0091434 | A1* | 4/2014 | Hopkins | H01L 27/10894 257/618 |
| 2015/0014821 | A1 | 1/2015 | Strocchia-Rivera | |

* cited by examiner

*Primary Examiner* — Cheung Lee
(74) *Attorney, Agent, or Firm* — Winston Hsu; Scott Margo

(57) ABSTRACT

A method of forming a semiconductor structure includes following steps. First of all, a patterned hard mask layer having a plurality of mandrel patterns is provided. Next, a plurality of first mandrels is formed on a substrate through the patterned hard mask. Following these, at least one sidewall image transferring (SIT) process is performed. Finally, a plurality of fins is formed in the substrate, wherein each of the fins has a predetermined critical dimension (CD), and each of the mandrel patterns has a CD being 5-8 times greater than the predetermined CD.

18 Claims, 17 Drawing Sheets

METHOD OF FORMING A SEMICONDUCTOR STRUCTURE

BACKGROUND OF THE INVENTION

1. Field of the Invention

The present invention relates to a method of forming a semiconductor structure, and more particularly to a method of forming a semiconductor structure which can tune pitch walking issues.

2. Description of the Prior Art

With increasing miniaturization of semiconductor devices, various multi-gate MOSFET devices have been developed. The multi-gate MOSFET is advantageous for the following reasons. First of all, the fabrication of the multi-gate MOSFET devices is allowable to be integrated into traditional logic device processes, and thus is more compatible. In addition, since the three-dimensional structure of the multi-gate MOSFET increases the overlapping area between the gate and the substrate, the channel region is controlled more effectively, thereby reducing both the drain-induced barrier lowering (DIBL) effect and the short channel effect. Moreover, as the channel region is longer for the same gate length, the current between the source and the drain is increased.

A multi-gate MOSFET has a gate formed on fin-shaped structures, wherein the fin-shaped structures is formed generally through a pattern transfer technique, such as the sidewall image transfer (SIT) process. However, with the demands of miniaturizing the semiconductor devices, the width of each fin-shaped structure, as well as the spacing therebetween both shrinks dramatically. Thus, forming fin-shaped structures which can achieve the required demands under the restrictions of miniaturization, physical limitations and various processing parameters becomes an extreme challenge.

SUMMARY OF THE INVENTION

It is one of the primary objectives of the present invention to provide a method of forming a semiconductor structure, in which the critical dimensions (CD) of the mandrels or spacers are allowed for timely adjusting during the SIT process, so as to obtain the fin-shape structure with accurate fin size and pitch.

To achieve the purpose described above, the present invention provides a method of forming a semiconductor structure including following steps. First of all, a patterned hard mask layer having a plurality of mandrel patterns is provided. Next, a plurality of first mandrels is formed on a substrate through the patterned hard mask layer. Then, at least one sidewall image transferring (SIT) process is performed. Finally, a plurality of fins is formed in the substrate, wherein each fins has a predetermined critical dimension, and each of the mandrel patterns has a CD being 5-8 times greater than the predetermined critical dimension.

In the method of forming a semiconductor structure of the present invention, the critical dimension of the mandrel patterns is controlled via timely checking and adjusting a width of each mandrel and each spacer in the SIT process. Thus, through the method of forming a semiconductor structure, it is sufficient to obtain fine fin-structure free from pitch walking issues.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details, as well as accompanying drawings, are given to provide a thorough understanding of the invention. It will, however, be apparent to one skilled in the art that the invention may be practiced without these specific details.

Figure 1:
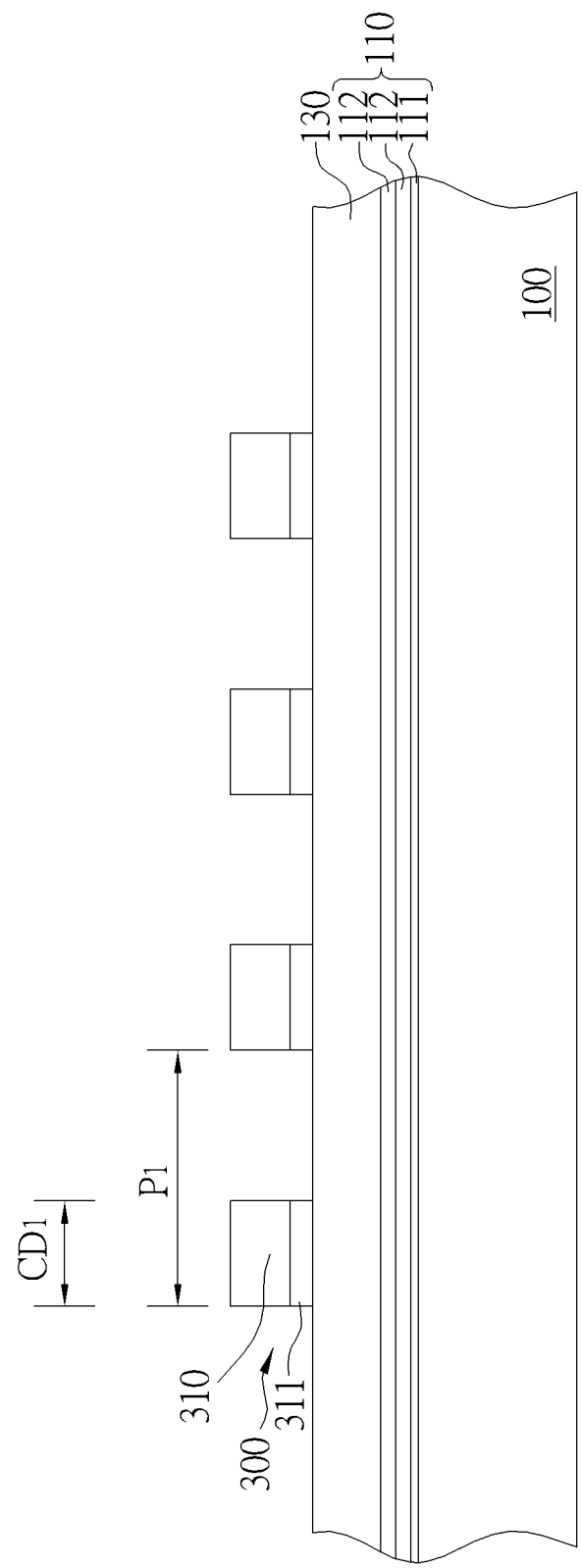
FIG. 1 to FIG. 4 are schematic diagrams illustrating a method of forming a semiconductor structure in accordance with a first embodiment of the present invention.

Please refer to FIGS. 1-4, which illustrate a method of forming a semiconductor structure in accordance with the first embodiment of the present invention. First of all, as shown in FIG. 1, a substrate 100 is provided, and a first hard mask layer 110, a second hard mask layer 130 and a photoresist layer 300 are formed sequentially on the substrate 100 from bottom to top. Precisely speaking, the substrate 100 for example is a semiconductor substrate, including silicon substrate, silicon germanium substrate, silicon carbide substrate, or silicon on insulator (SOI). The first hard mask layer 110 and the second hard mask layer 130 are entirely formed on a top surface of the substrate 100, for example, through a chemical vapor deposition (CVD) process or a physical vapor deposition (PVD) process, wherein the first hard mask layer 110 and the second hard mask layer 130 may include a monolayer structure or a multi-layer structure including oxide layer or a nitride layer. In one embodiment of the present invention, the first hard mask layer 110 includes a composite structure having a first layer 111 of oxide, a second layer 112 of silicon nitride (SiN) and a third layer 113 of oxide; and the second hard mask layer 130 includes a single layer of polysilicon or nitride, but not limited thereto.

It is noted that, in one embodiment of the present invention, the photoresist layer 300 includes a plurality of mandrel patterns 310 regularly arranged on the second hard mask layer 130. For example, each of the mandrel patterns may has a critical dimension $CD_1$ being substantially between 50 nanometers and 70 nanometers, and spaced from each other in a pitch $P_1$ as shown in FIG. 1. However, the patterns of the photoresist layer 300 in the present invention is not limited to the above-described, but may include other arrangements or allocations which are well known by one skilled in the arts.

Figure 2:
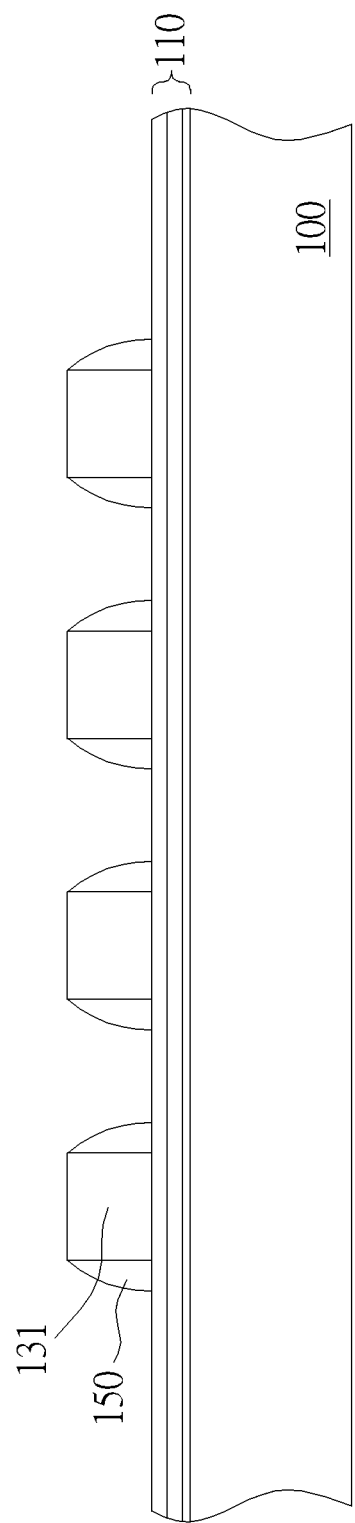

Next, as shown in FIGS. 1-2, the mandrel patterns 310 of the photoresist layer 300 are then transferred to the second hard mask layer 130 underneath, thereby forming a plurality of first mandrels 131. In one embodiment of the present invention, the method of forming the first mandrels 131 may comprise firstly transferring mandrel patterns 310 of the photoresist layer 300 to a mask layer 311 underneath, and transferring patterns of the mask layer 311 to the second hard mask layer 130, thereby forming the first mandrels 131. Preferably, the mask layer 311 and the first mandrels 131 which are formed according to the mandrel patterns 310 may have the same critical dimension to the $CD_1$. In one embodiment of the present invention, the critical dimension of the first mandrels 131 is checked through an after-develop-inspection (ADI) process or an after-etch-inspection (AEI) process. Also, in another embodiment of the present invention, an etching process may be further performed to trim the first mandrels 131, for adjusting the critical dimension thereof.

Subsequently, after the photoresist layer 300 is removed, a first spacer material layer (not shown in the drawings) is formed on the first hard mask layer 110 entirely to cover the first mandrels 131. After that, an etching back process is performed to remove a portion of the first spacer material layer, to expose a portion of the first hard mask layer 110 and to form a plurality of first spacers 150 surrounding the first mandrels 131 respectively. In one embodiment of the present invention, the first spacers 150 may include a material having etching selectivity relative to the first mandrels 131, such as nitride, but not limited thereto.

Figure 3:
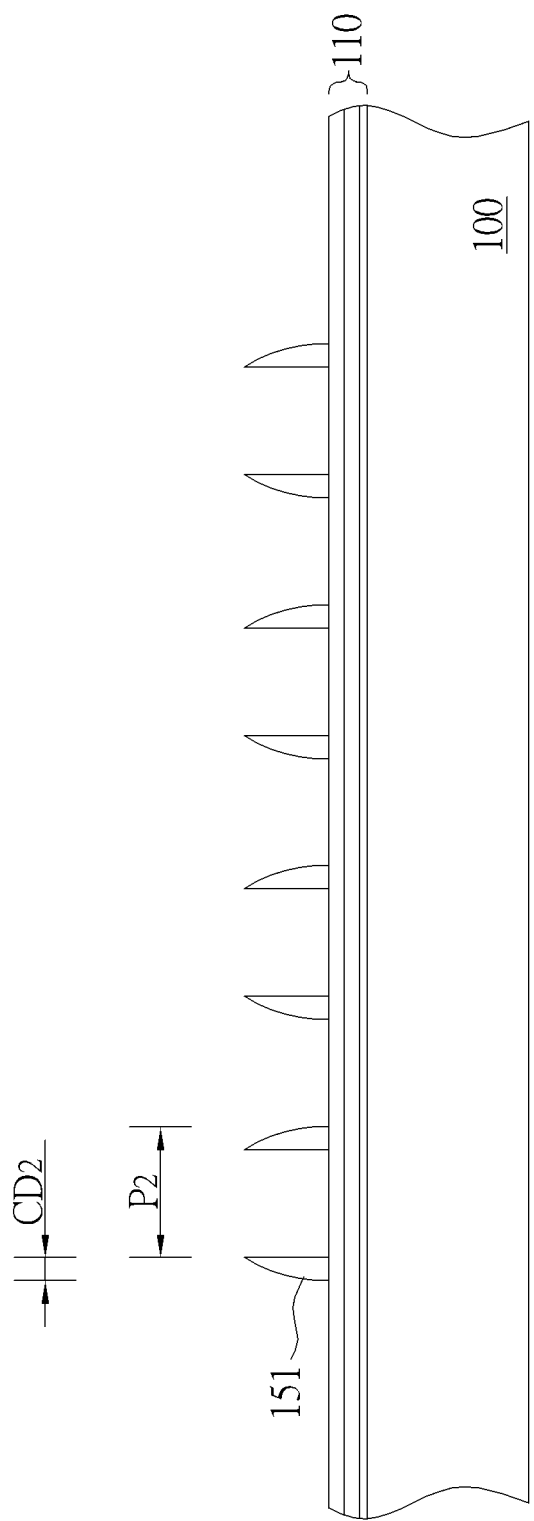

It is also worth noting that, the first spacers 150 may have a pitch being ½ of the pitch $P_1$ of the mandrel patterns 310. In one embodiment of the present invention, a checking process is performed to check the pitch of the first spacers 150 substantially being ½ of the pitch $P_1$. Furthermore, in another embodiment of the present invention, an adjusting process may be carried out while the pitch of the first spacers 150 is less than ½ of the pitch $P_1$. For example, the adjusting process is performed by trimming a width of the first spacers 150 via a dry etching process, a wet etching process or a sequentially performed dry and wet etching process. With such trimming process, the width of the first spacers 150 is reduced, such that the critical dimension and pitch thereof may be adjusted accordingly, obtaining first spacers 151 having the adjusted critical dimension $CD_2$ and the adjusted pitch $P_2$ being ½ of the pitch $P_1$, as shown in FIG. 3. In other words, a critical dimension of the first spacers 150 is checked and optionally adjusted in this step.

Figure 4:
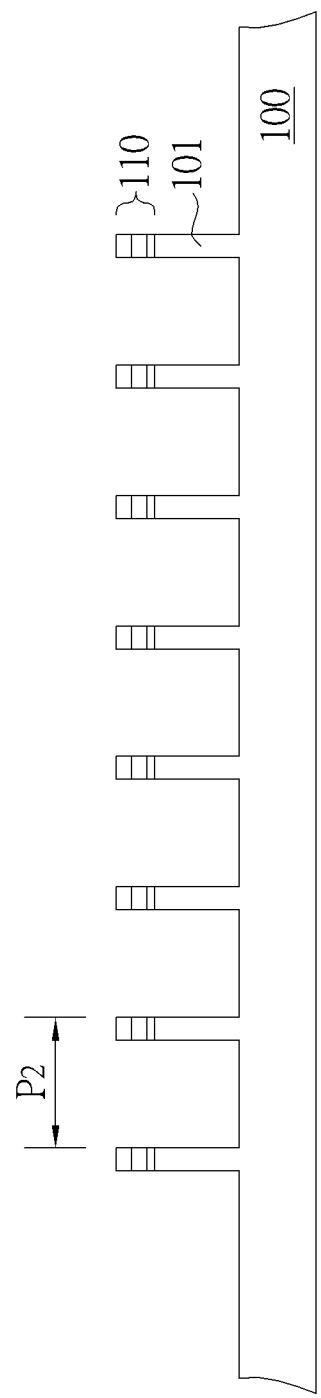

Then, after the first mandrels 131 are removed through the etching selectivity between the first mandrels 131 and the first spacers 151, a fin-shaped structure having a plurality of fins 101 is formed in the substrate 100 as shown in FIG. 4, by using the first spacers 151 to serve as hard masks. Preferably, while forming the fin-shaped structure, the pattern of the first spacers 151 is firstly transferred to the first hard mask layer 110, for example through an etching process (such as a dry etching process, a wet etching process, or a sequentially performed dry and wet etching process), and the pattern of the first hard mask layer 110 is then further transferred to the substrate 100 underneath after removing the first spacers 151. However, in another embodiment of the present invention, the fin-shaped structure may also be formed by directly transferring the patterns of the first spacers 151 to the first hard mask layer 110 and the substrate 100, and removing the first spacers 151 in the following.

Thus, through the aforementioned steps, the semiconductor structure of the first embodiment may be obtained. After these, an insulation layer (not shown in the drawings) may be formed on the semiconductor structure between the fins 101 to configure as shallow trench isolation (STI; not shown in the drawings), and a gate structure (not shown in the drawings) may be further formed across the fin shaped structures, for example, after the first hard mask layer 110 is removed, to serve as a multi-gate structure.

Figure 5:
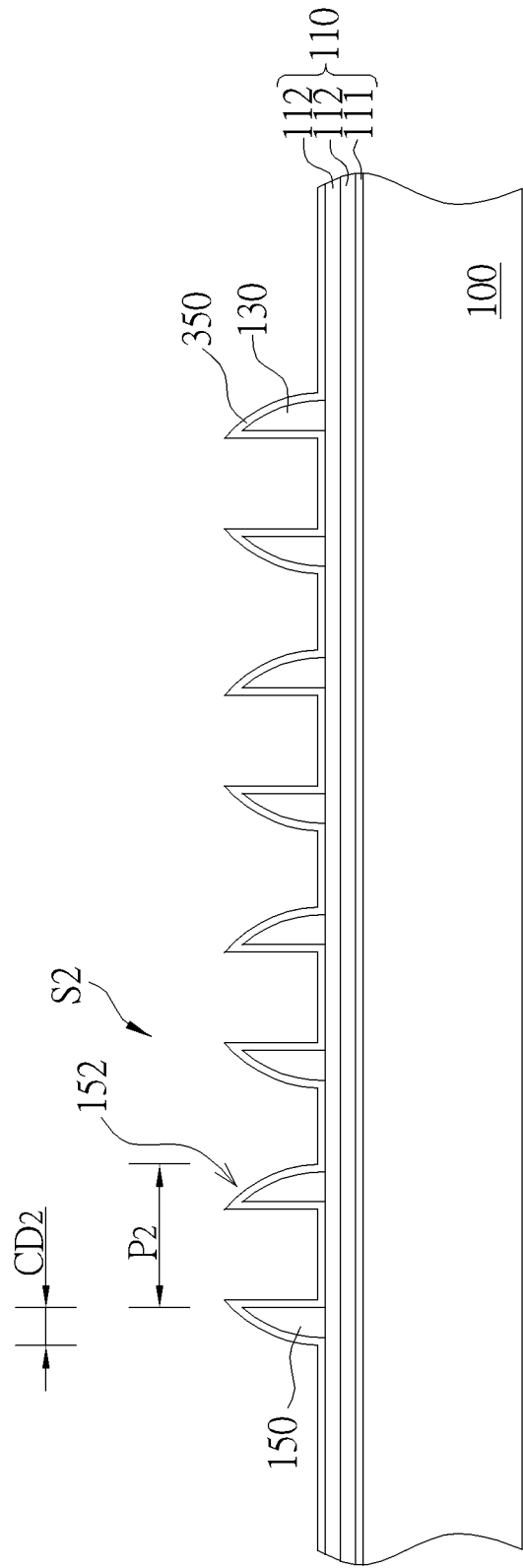
FIG. 5 is schematic diagram illustrating other steps of the method of forming a semiconductor structure in accordance with the first embodiment of the present invention.

However, the method of forming the semiconductor structure of the first embodiment is not limited to the above-mentioned steps, but may include other processes. For example, in one embodiment of the present invention, the adjusting process may also be carried out while the pitch of the first spacers 150 is greater than ½ of the pitch $P_1$, for example, through additionally forming a masking layer 350 as shown in FIG. 5 on the first spacers 150 and the first hard mask layer 110. Wherein, the masking layer 350 may be formed through a CVD, a PVD process or a thermal process (such as an oxidization process or a nitridation process) to cover on the first spacers 150, thereby forming a plurality of first spacers 152 having a relative greater width, an adjusted critical dimension $CD_2$, as well as an adjusted pitch $P_2$ being ½ of the pitch $P_1$. Also, in another embodiment, the masking layer may also be optionally formed after the pattern of the first spacers has been transferred to the first hard layer 110, which means forming the masking layer on the patterned first hard mask layer for adjusting the pitch thereof. In another embodiment of the present invention, the checking process may also be performed after the first mandrels 131 are removed, or a rechecking process may be further performed after the first mandrels 131 are removed, for rechecking the critical dimension and the pitch of the first spacers 150. Furthermore, in another embodiment, the adjusting process may also be performed after the first mandrels 131 are removed, or a re-adjusting process may be further performed after the first mandrels 131 are removed, for maintaining the centralization of the first spacers 151.

It is worth mentioning that, the method of the present invention can form the fin-shaped structures having substantially the same critical dimension approaching ⅕ to ⅛ of the aforementioned critical dimension $CD_1$ (patterns of the photoresist layer), preferably around 10 nanometers or less. In other words, through the present invention, the fin-shaped structures in accurate critical dimension may be easily obtained by timely checking and adjusting the critical dimension of each mandrel and each spacer during the SIT process. Accordingly, the critical dimension of the photoresist patterns may be easily defined to be 5 to 8 times greater than a predetermined critical dimension of fin-shaped structure, so as to simplify the method of forming such semiconductor structure.

The following description will detail other different embodiments or variant embodiments of the method of forming the semiconductor structure of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 6:
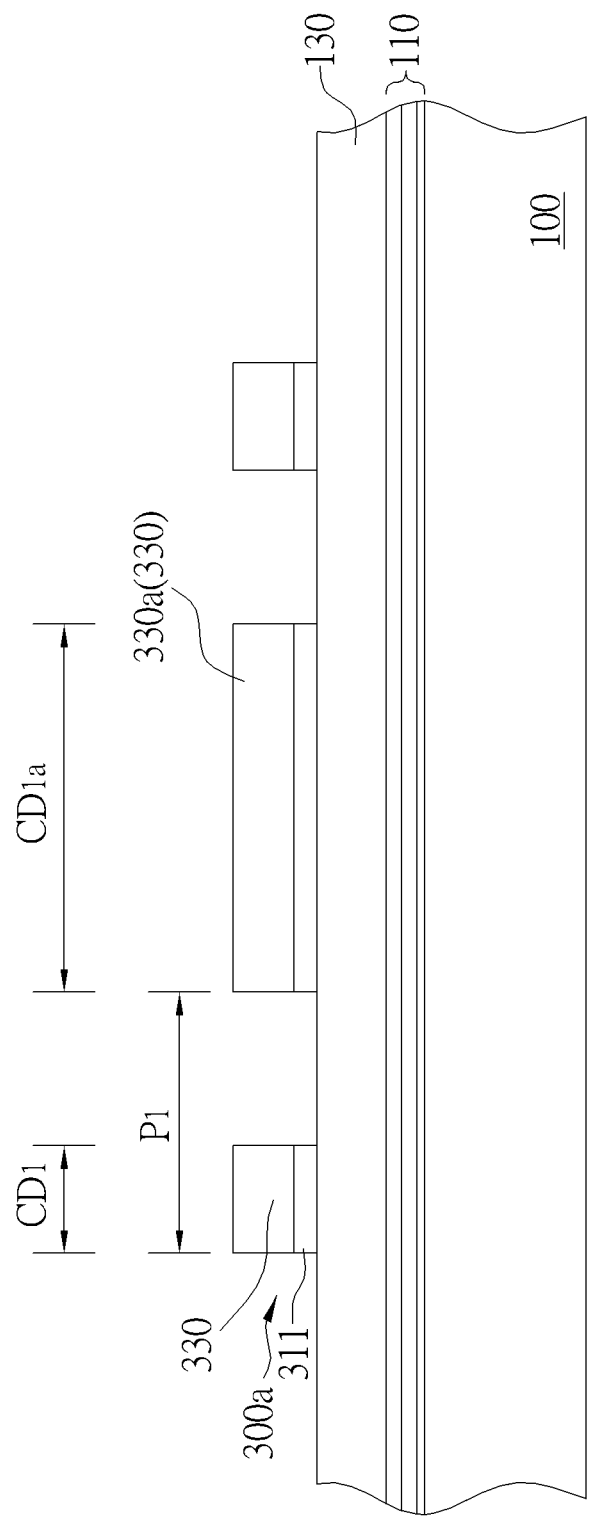
FIG. 6 to FIG. 7 are schematic diagrams illustrating a first variant of the first embodiment of the present invention.
Figure 7:
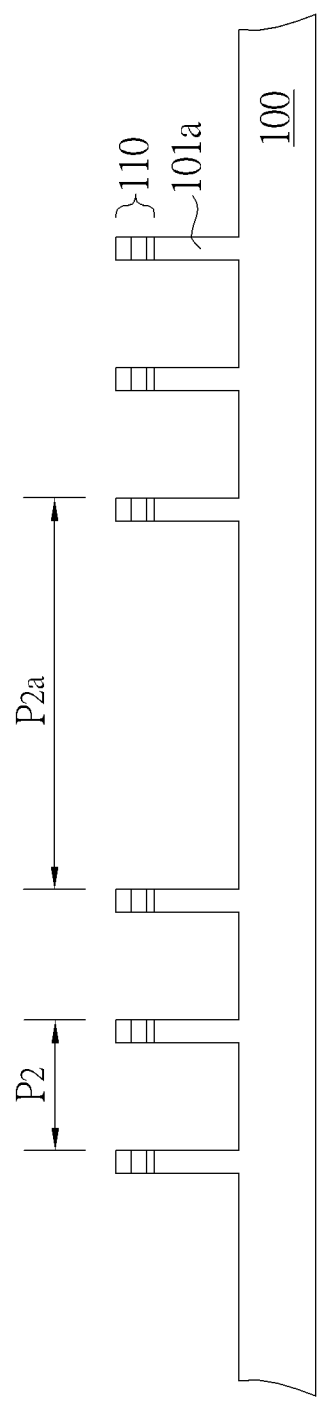

Please refer to FIGS. 6-7, which illustrate a method of forming the semiconductor structure in accordance with a first variant of the first embodiment of the present invention. As shown in FIG. 6, the difference between the present embodiment and the aforementioned first embodiment is in that a photoresist layer 300a of the present embodiment may include irregularly arranged mandrel patterns 330. For example, at least one mandrel pattern 330a may have a different critical dimension $CD_{1a}$, such as being 10 to 20 times greater than the predetermined critical dimension of the fin-shaped structure, but spaced from others by a same space. In other words, the photoresist layer 300a of the present embodiment may have mandrel patterns 330 in variant pitch and critical dimension, such that, the fin-shaped structure having fins 101a of different pitches $P_2$, $P_{2a}$ as shown in FIG. 7 may be formed accordingly. However, except for the aforementioned differences, other steps of the method in the present embodiment are all similar to that of the aforementioned first embodiment and will not be redundantly described herein.

Figure 8:
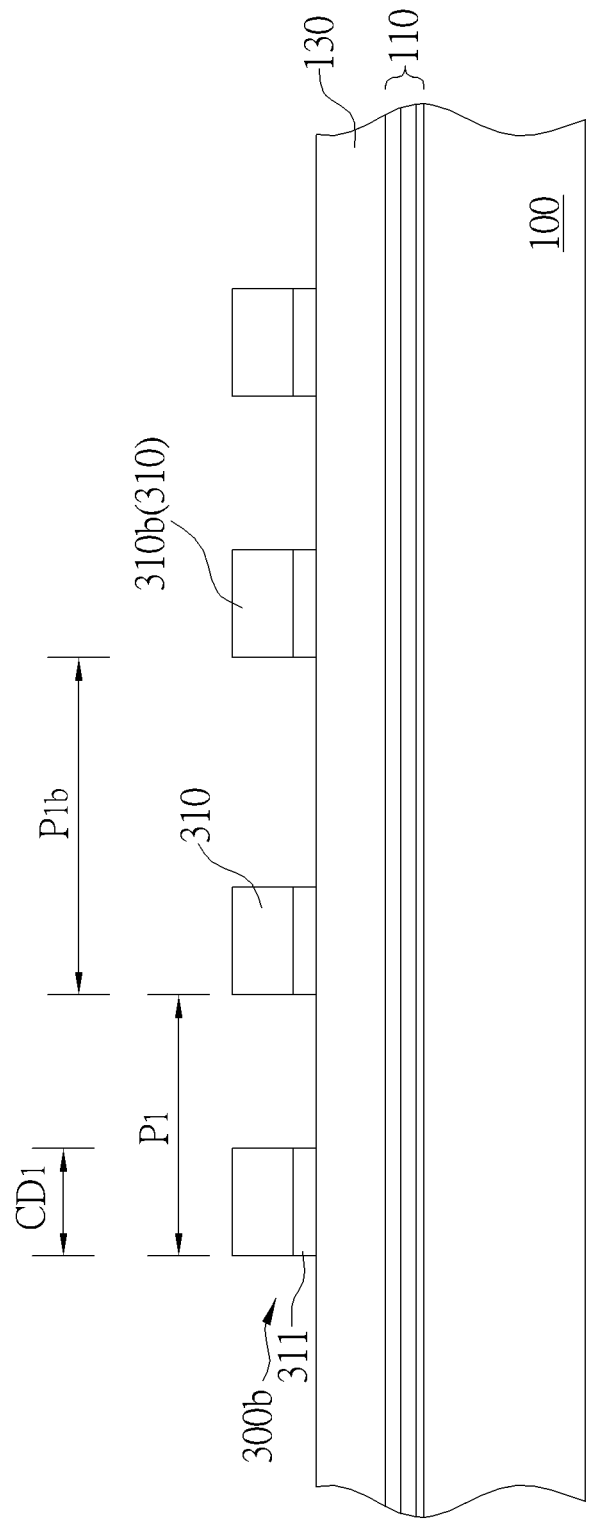
FIG. 8 to FIG. 9 are schematic diagrams illustrating a second variant of the first embodiment of the present invention.
Figure 9:
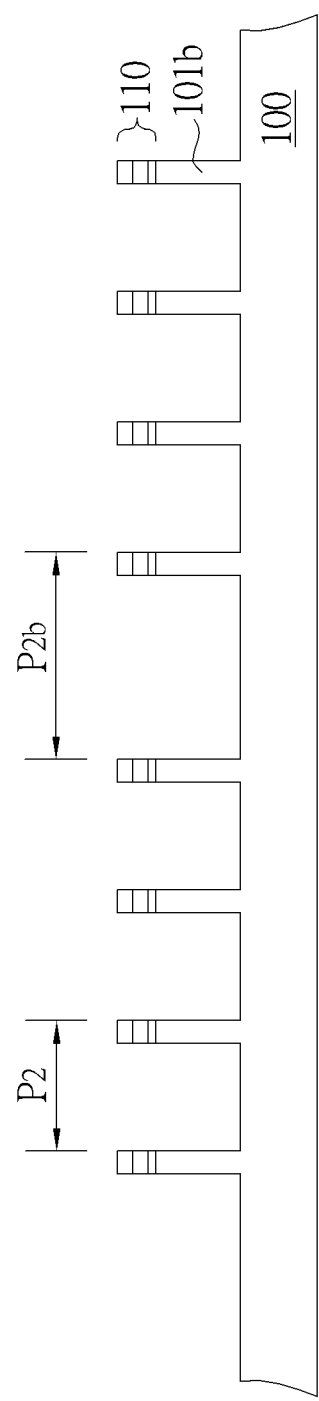

Please refer to FIGS. 8-9, which illustrate another method of forming the semiconductor structure in accordance with the second variant of the first embodiment of the present invention. In comparison with the aforementioned first variant, although also having an irregularly arranged mandrel patterns, a photoresist layer 300b of the present embodiment only has mandrel patterns in different pitches, as shown FIG. 8. In other words, all of the mandrel patterns 310 on the photoresist layer 300b have the same critical dimension $CD_1$, but at least one 310b of them has a different pitch $P_{1b}$ from others. Thus, the fin-shaped structure 101b formed according thereto may have fins 101b of different pitches $P_2$, $P_{2b}$ as shown in FIG. 9.

Please note that, although being formed through irregular arranged photoresists, the fin-shaped structures formed in the aforementioned variant embodiments may also have substantially the same critical dimension approaching 1/5 to 1/8 of the aforementioned critical dimension $CD_1$. Thus, the critical dimension of the photoresist patterns on such irregular arranged photoresists may also be easily defined to be 5 to 8 times greater than a predetermined critical dimension of the fin-shaped structure, so as to simplify the forming method thereof. Furthermore, although the above-mentioned variant embodiment and the first embodiment are all exemplified on a single sidewall image transferring (SSIT) process, the present invention is not limited thereto but may be further applied on other process, such as a dual sidewall image transferring processes (DSIT) detailed below.

Figure 10:
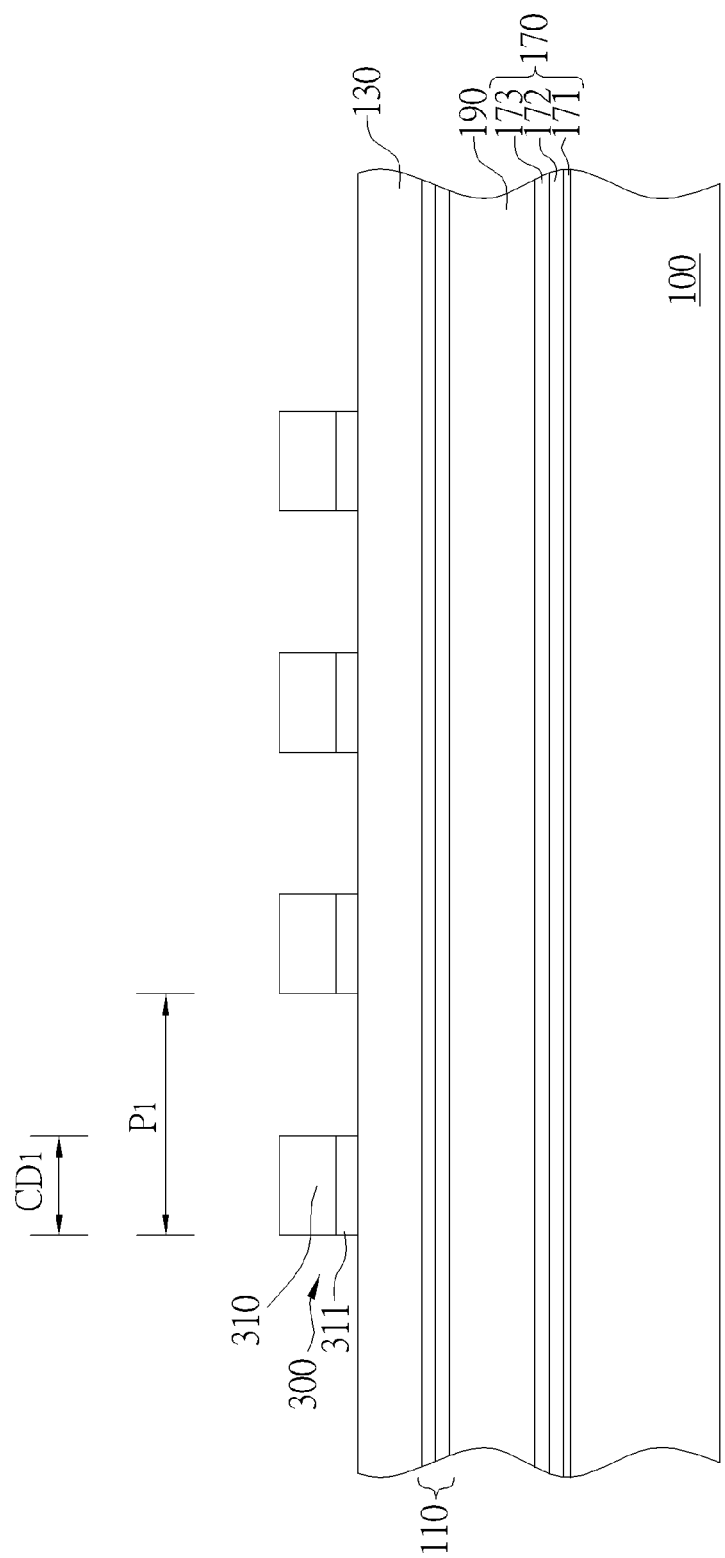
FIG. 10 to FIG. 14 are schematic diagrams illustrating a method of forming a semiconductor structure in accordance with a second embodiment of the present invention.

Referring to FIGS. 10-14, FIGS. 10-14 illustrate a method of forming a semiconductor structure in accordance with the second embodiment of the present invention. As shown in FIG. 10, the difference between the present embodiment and the aforementioned first embodiment is in that a third hard mask layer 170 and a fourth hard mask layer 190 are further formed on the substrate 100, before the first hard mask layer 110 and the second hard mask 130 are formed, wherein the third hard mask layer 170 and the fourth hard mask layer 190 may include the same material and structure as that of the first hard mask layer 110 and the second hard mask 130, but not limited thereto. In one embodiment of the present invention, the third hard mask layer 170 includes a composite structure having a fourth layer 171 of oxide, a fifth layer 172 of silicon nitride (SiN), and a sixth layer 173 of oxide; and the fourth hard mask layer 190 includes a single layer of polysilicon, but in another embodiment, the third hard mask layer 170 and the fourth hard mask layer 190 may also include other mask materials having etching selectivity.

Figure 11:
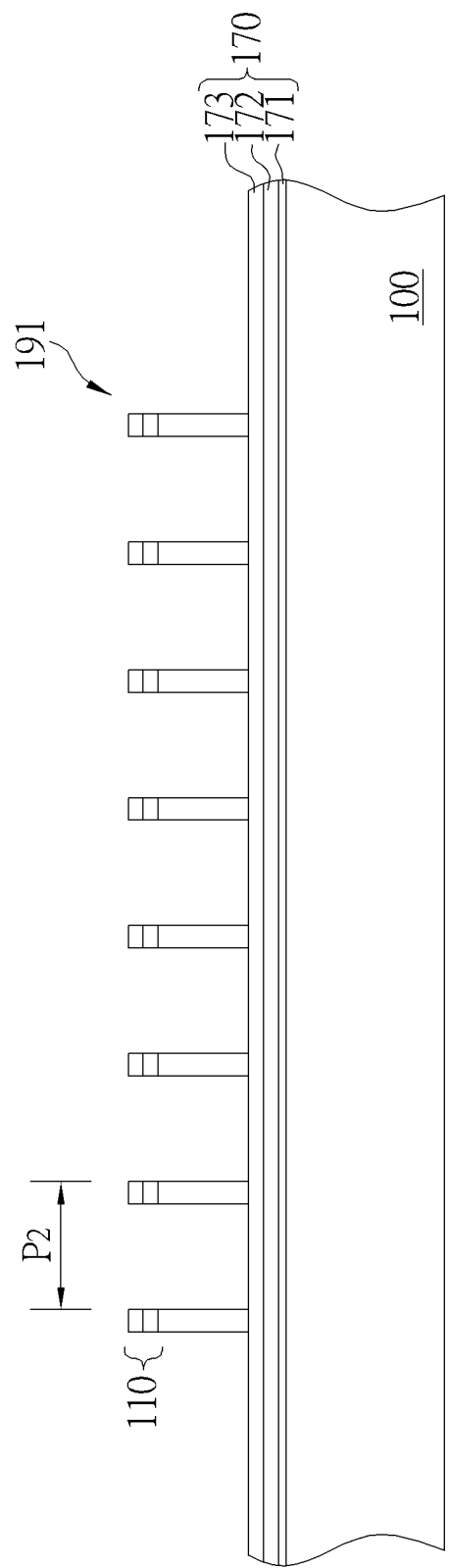

In addition, the formal steps in the present embodiment are primary performed based on steps shown in FIGS. 1-3 of the first embodiment, such as forming a plurality of first mandrels (not shown in FIG. 10) according to the photoresist 300, forming a plurality of first spacers surrounding the first mandrels, and optionally performing the checking process and/or the pitch-adjusting process, and the details thereof will not redundantly described herein. Subsequently, as shown in FIG. 11, a plurality of second mandrels 191 is formed by using the first spacers 151 (as shown in FIG. 3) to serve as hard masks. Precisely speaking, while forming the second mandrels 191, the pattern of the first spacers 151 (as shown in FIG. 3) is firstly transferred to the first hard mask layer 110, for example through an etching process (such as a dry etching process, a wet etching process, or a sequentially performed dry and wet etching process), and the pattern of the first hard mask layer 110 is then further transferred to the fourth hard mask layer 190 underneath after removing the first spacers 151. It is worth mentioning that, the second mandrels 191 may also have the pitch $P_2$ being 1/2 of the pitch $P_1$ due to being transferred from the first spacers 151.

Figure 12:
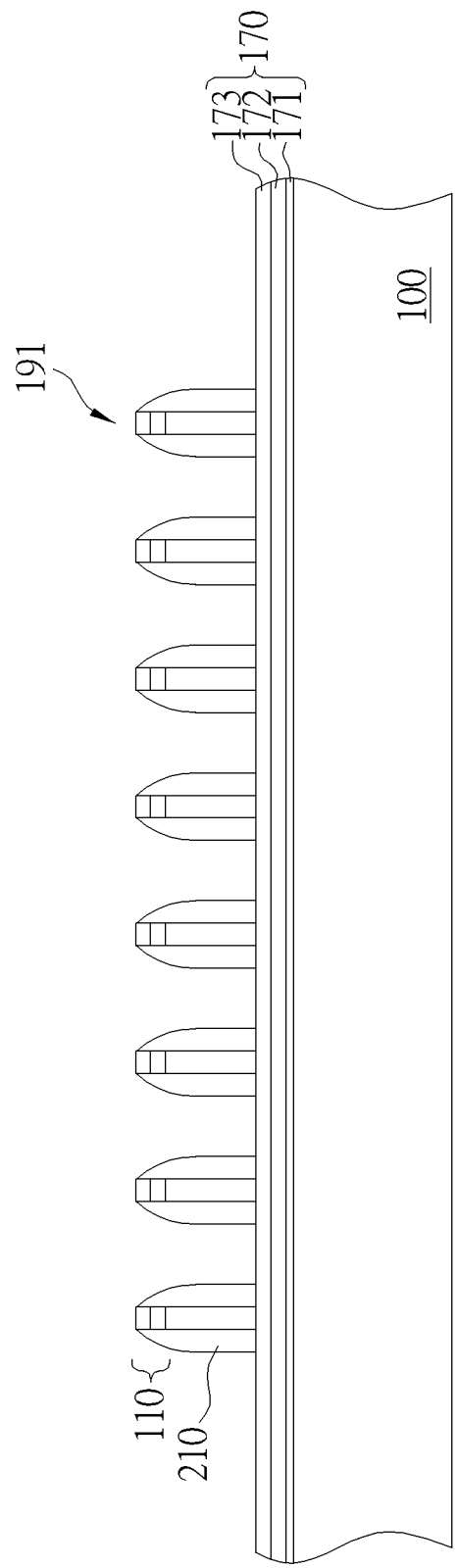

In the following, as shown in FIG. 12, a second spacer material layer (not shown in the drawings) is formed on the third hard mask layer 170 entirely, covering the second mandrels 191. After that, another etching back process is performed to remove a portion of the second spacer material layer, to expose a portion of the third hard mask layer 170 and to form a plurality of second spacers 210 surrounding the second mandrels 191 respectively. In one embodiment of the present invention, the second spacers 210 may be formed through the same forming method and materials of the first spacers 150 (as shown in FIG. 2), but not limited thereto. In another embodiment of the present invention, the second spacers 210 may include other materials having etching selectivity relative to the second mandrels 191 and the first hard mask layer 110, and be formed through another process which is well known by one skilled in the arts and will not be further detailed hereafter.

Figure 13:
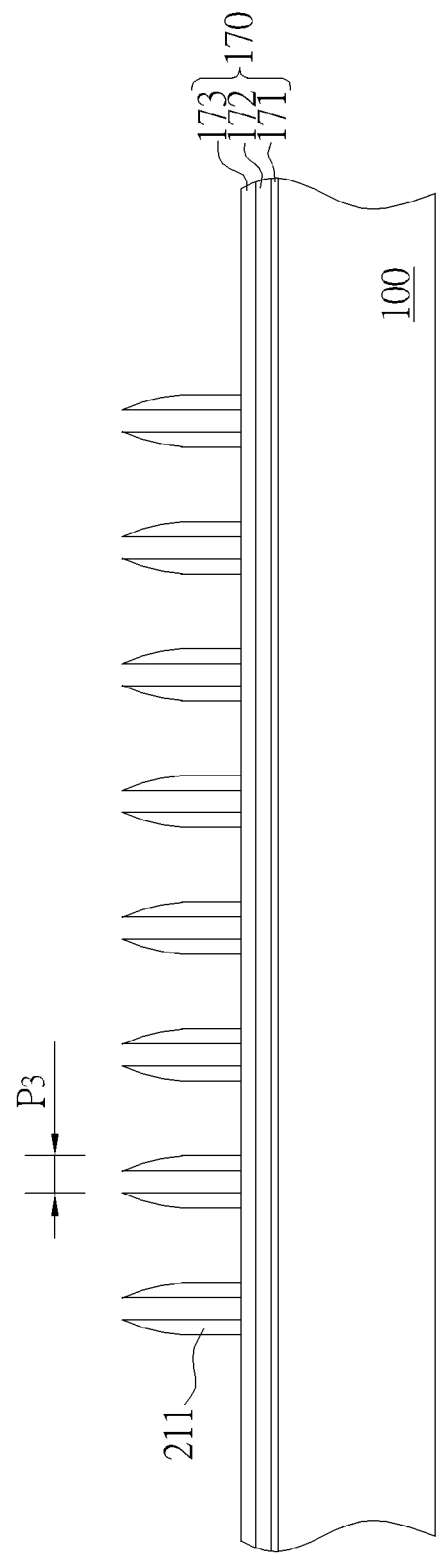

Please note that, the second spacers 210 may have a pitch being 1/4 of the pitch $P_1$. In one embodiment of the present invention, another checking process is performed to check the pitch of the second spacers 210 substantially being 1/4 of the pitch $P_1$. Furthermore, in another embodiment of the present invention, an adjusting process may be carried out while the pitch of the second spacers 210 is less than 1/4 of the pitch $P_1$. For example, the another adjusting process is performed by trimming a width of the second spacers 210 through a dry etching process, a wet etching process or a sequentially performed dry and wet etching process. With such trimming process, the width of the second spacers 210 is reduced, such that the critical dimension and the pitch thereof may be adjusted accordingly, obtaining second spacers 211 having the adjusted critical dimension and the adjusted pitch $P_3$ being 1/4 of the pitch $P_1$, as shown in FIG. 13. In other words, a critical dimension of the second spacers 210 is checked and optionally adjusted in this step.

However, in another embodiment of the present invention, the checking process may also be performed after the second mandrels 191 are removed, or another rechecking process may be additionally performed after the second mandrels 191 are removed, for rechecking the critical dimension and the pitch of the second spacers 210. Furthermore, in another embodiment, the adjusting process may also be performed after the second mandrels 191 are removed, or another re-adjusting process may be further performed after the second mandrels 191 are removed, for maintaining the centralization of the second spacers 211. Please also note that, the method of the present embodiment is not limited to the above-mentioned steps, but may further include other processes known by people in the arts, such as carrying out the another adjusting process while the pitch of the second spacers 210 is greater than 1/4 of the pitch $P_1$, to adjust the pitch and the critical dimension of the second spacers 210 by increasing a width of the second spacers 210 by additionally via forming another mask layer.

Figure 14:
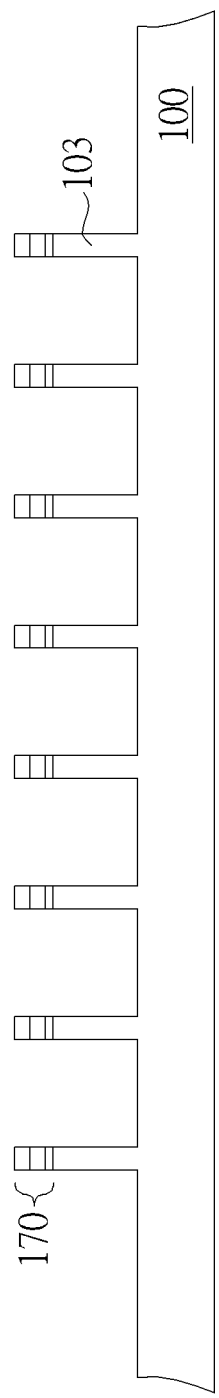

Then, after the second mandrels 191 are removed through the etching selectivity between the second mandrels 191 and the second spacers 211, a fin-shaped structure having a plurality of fins 103 as shown in FIG. 14 is formed in the substrate 100 by using the second spacers 211 to serve as hard masks. Likewise, while forming the fin-shaped structure, the pattern of the second spacers 211 is firstly transferred to the third hard mask layer 170, for example through an etching process (such as a dry etching process, a wet etching process, or a sequentially performed dry and wet etching process), and the pattern of the third hard mask layer 170 is then further transferred to the substrate 100 underneath after removing the second spacers 211.

Thus, through the aforementioned steps, the semiconductor structure of the second embodiment may be obtained. After these, an insulation layer (not shown in the drawings) may be formed on the semiconductor structure between the fins 103 to configure as shallow trench isolation (STI; not shown in the drawings), and a gate structure (not shown in the drawings) may be further formed across the fin shaped structures, for example, after the third mask layer 170 is removed, to serve as a multi-gate structure.

It is worth mentioning that, the method of the present invention may also be used on a dSIT process to form the fins 103 having substantially the same width critical dimension approaching ⅕ to ⅛ of the aforementioned critical dimension $CD_1$, preferably around 10 nanometers or less. It is also known that, the present invention repeatedly checks and timely adjusts the critical dimension of each mandrel (including first mandrels and second mandrels) and each spacer (including first spacers and second spacers) during the dSIT process, thus that the pitch walking issues may be efficiently avoided. In this way, the critical dimension of the mandrels, even for the dSIT process, may also be easily to define as 5 to 8 times greater than a predetermined CD of fin-shaped structures, thereby dramatically simplifying the method of forming such semiconductor structure, and also improving the accuracy of fin size.

Figure 15:
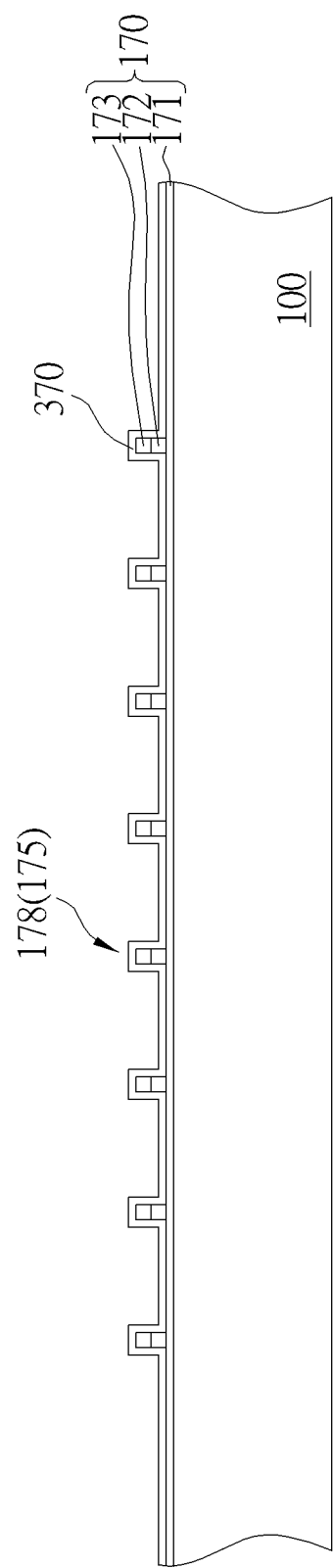
FIG. 15 to FIG. 17 are schematic diagrams illustrating a method of forming a semiconductor structure in accordance with a third embodiment of the present invention.
Figure 16:
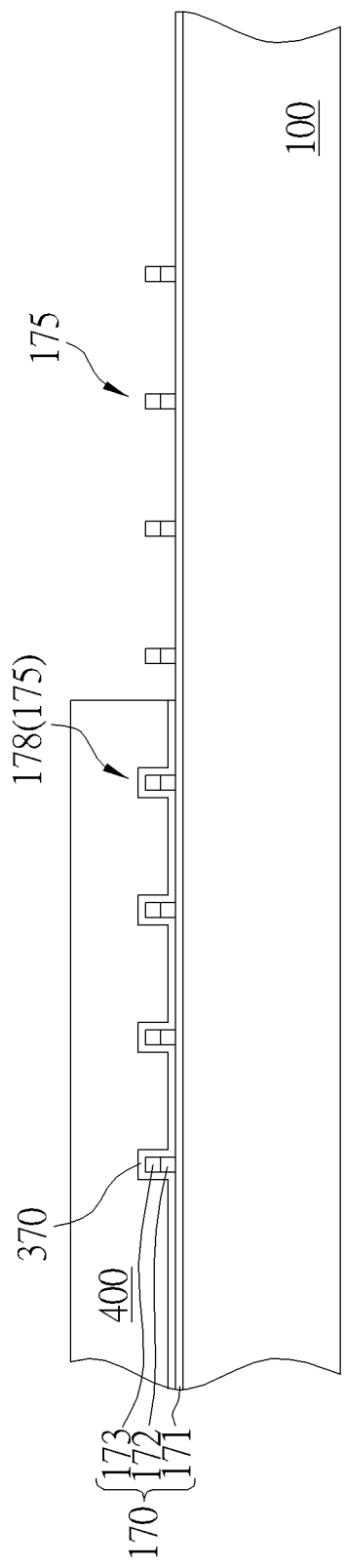
Figure 17:
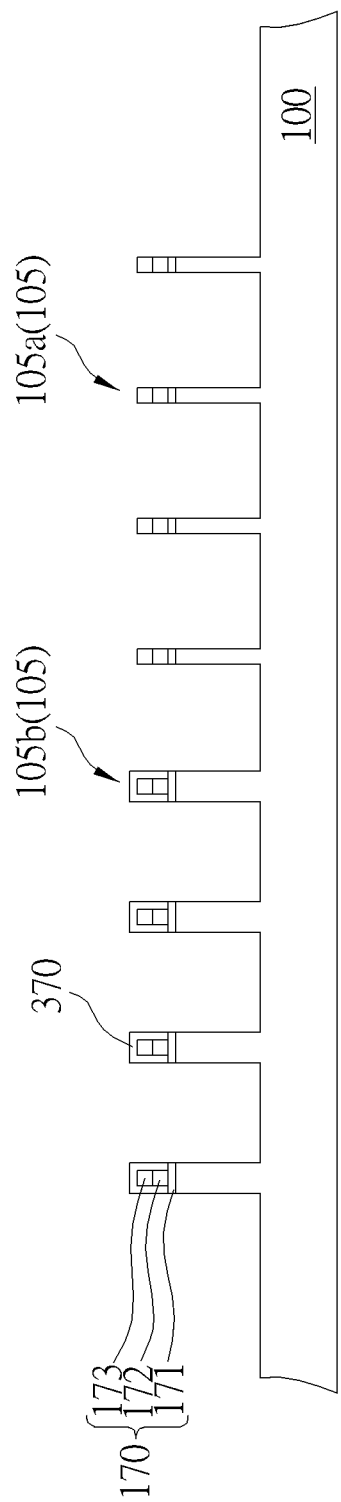

Please refer to FIGS. 15-17, which illustrate a method of forming the semiconductor structure in accordance with the third variant of the first embodiment of the present invention. Generally, the formal steps in the present embodiment are similar to those in FIGS. 10-13 in the second embodiment and are not redundantly described herein. As shown in FIGS. 15-16, the difference between the present embodiment and the aforementioned second embodiment is in that a plurality of third mandrels 175 is formed by using the second spacers 211 to serve as hard masks. Precisely, the patterns of the second spacers 211 is transferred to the fifth layer 172 and the sixth layer 173 of the third hard mask layer 170 to form the third mandrels 175, and a masking layer 370 is entirely formed on the substrate 100, to cover the third mandrels 175 and the fourth layer 171, thereby forming a plurality of fourth mandrels 178 as shown in FIG. 15.

Subsequently, a sacrificial material layer (not shown in the drawings) is formed on the substrate 100, covering the fourth mandrels 178 and the masking layer 370 entirely, and which is then patterned to partially expose the fourth mandrels 178 and the masking layer 370 covering on the substrate 100, thereby forming a sacrificial mask layer 400 only covering a portion of the fourth mandrels 178 and a portion of the masking layer 370 as shown in FIG. 16. As following, an etching process is performed by using the sacrificial masking layer 400 to serve as hard masks, to remove a portion of the masking layer 370 exposed by the sacrificial mask layer 400, so that, the portion of the third mandrels 175 underneath is exposed. Please note that, after the sacrificial mask layer 400 is completed removed from the substrate 100, the third mandrels 175 and the fourth mandrels 178 are remained, wherein the third mandrels 175 and the fourth mandrels 178 have different widths, also known as different critical dimensions, from each other.

Then, as shown in FIG. 17, the pattern of the third mandrels 175 and the fourth mandrels 178 are simultaneously transferred to the fourth layer 171 and the substrate 100 underneath, to form a plurality of fins 105, for example through an etching process which is known by person in the arts and will not be redundantly described. It is worth mentioning that, since the fins 105 are formed by using the third mandrels 175 and the fourth mandrels 178 to serve as hard masks, the fins 105 may include first fins 105a and second fins 105b having different widths (also known as different critical dimensions). However, the method of the third embodiment is not limited to the above-mentioned steps, but may include other processes. For example, in other embodiments, the masking layer may be optionally formed after covering the portion of the third mandrels with the sacrificial mask layer, or the masking layer is omitted and an additional etching process may be carried out after covering the portion of the third mandrels with the sacrificial mask layer, for forming the semiconductor structure having fins in different widths.

Additionally, it is worth mentioning that, such sacrificial mask layer may also be applied on the aforementioned embodiments and variant embodiments, for example, covering either a portion of the first spacers 151 shown in FIG. 3 or a portion of the second spacers 211 shown in FIG. 13, for forming a semiconductor structure having fins in different widths (critical dimensions).

Thus, through the aforementioned steps, the semiconductor structure of the third embodiment may be obtained. After these, an insulation layer (not shown in the drawings) may be formed on the semiconductor structure between the fins 105 to configure as shallow trench isolation (STI; not shown in the drawings), and a gate structure (not shown in the drawings) may be further formed across the fin shaped structures, for example, after the third mandrels 175, the fourth mandrels 178 and the fourth layer 171 are all removed, to serve as a multi-gate structure.

In summary, through the method of forming the semiconductor structure in the present invention, the critical dimension of mandrels and spacers are repeatedly checked and adjusted during the SIT process (including SSIT process and DSIT process), thus that, the accurate semiconductor structure being free from pitch walking issues may be efficiently obtained. Also, through timely trimming the aforementioned mandrels and spacers or forming the additional masking layer, the critical dimension of the fin-shaped structures may be successfully maintain at substantially ⅕ to ⅛ of the aforementioned critical dimension $CD_1$ (patterns of the photoresist layer), preferably around 10 nanometers or less. In other words, through the method of the present invention, the critical dimension of the primary mandrels may be easily to define as 5 to 8 times greater than a predetermined critical dimension of fin-shaped structure, so as to simplify the method of forming such semiconductor structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor structure, comprising:
   providing a photoresist layer having a plurality of mandrel patterns;
   forming a plurality of first mandrels on a substrate through the photoresist layer;
   performing at least one sidewall image transferring (SIT) process;
   forming a plurality of third mandrels on the substrate through the SIT process;
   forming a masking layer on the third mandrels and the substrate;
   removing the masking layer on at least a portion of the third mandrels; and
   forming a plurality of fins in the substrate through the masking layer and the third mandrels, wherein each of the fins has a predetermined critical dimension, at least one of the fins has a different critical dimension from others and each of the mandrel patterns has a critical dimension being 5-8 times greater than the predetermined critical dimension.

2. The method of forming a semiconductor structure of claim 1, further comprising:
   transferring the mandrel patterns of the photoresist layer to a mask layer under the photoresist layer, and the mask layer having a critical dimension being 5-8 times greater than the predetermined critical dimension.

3. The method of forming a semiconductor structure of claim 1, further comprising:
   forming a plurality of first spacers on the substrate, the first spacers surrounding the first mandrels respectively;
   removing the first mandrels from the substrate; and
   forming the third mandrels through the first spacers.

4. The method of forming a semiconductor structure of claim 3, further comprising:
   checking a critical dimension of the first spacers.

5. The method of forming a semiconductor structure of claim 4, further comprising:
   trimming a width of the first spacers to adjust the critical dimension of the first spacers.

6. The method of forming a semiconductor structure of claim 5, wherein the trimming of the first spacers is performed after the first mandrels are removed.

7. The method of forming a semiconductor structure of claim 5, wherein the trimming of the first spacers is performed before the first mandrels are removed.

8. The method of forming a semiconductor structure of claim 4, further comprises:
   forming another masking layer on the first spacers to adjust the critical dimension of the first spacers.

9. The method of forming a semiconductor structure of claim 1, further comprising:
   forming a plurality of first spacers on the substrate, the first spacers surrounding the first mandrels respectively;
   removing the first mandrels from the substrate;
   forming a plurality of second mandrels through the first spacers;
   forming a plurality of second spacers on the substrate, the second spacers surrounding the second mandrels respectively;
   removing the second mandrels; and
   forming the third mandrels in the substrate through the second spacers.

10. The method of forming a semiconductor structure of claim 9, further comprising:
    checking a critical dimension of the first spacers.

11. The method of forming a semiconductor structure of claim 9, further comprising:
    checking a critical dimension of the second spacers.

12. The method of forming a semiconductor structure of claim 11, further comprising:
    trimming a width of the second spacers to adjust the critical dimension of the second spacers.

13. The method of forming a semiconductor structure of claim 12, wherein the trimming of the second spacers is performed after the second mandrels are removed.

14. The method of forming a semiconductor structure of claim 12, wherein the trimming of the second spacers is performed before the second mandrels are removed.

15. The method of forming a semiconductor structure of claim 1, further comprising:
    forming at least one of the fins having a different pitch from others.

16. The method of forming a semiconductor structure of claim 15, wherein the photoresist layer comprises at least one mandrel pattern having a different pitch from others.

17. The method of forming a semiconductor structure of claim 15, wherein the photoresist layer comprises at least one mandrel pattern having a different critical dimension from others.

18. The method of forming a semiconductor structure of claim 17, wherein the at least one mandrel pattern has a critical dimension being 10-20 times greater than the predetermined critical dimension.

* * * * *